(12) United States Patent
Sehirlioglu et al.

(10) Patent No.: US 8,518,291 B2
(45) Date of Patent: Aug. 27, 2013

(54) HIGH TEMPERATURE PIEZOELECTRIC CERAMICS

(75) Inventors: Alp Sehirlioglu, Lakewood, OH (US); Ali Sayir, Bay Village, OH (US); Fred Dynys, Chagrin Falls, OH (US)

(73) Assignees: Case Western Reserve University, Cleveland, OH (US); The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 13/556,636

(22) Filed: Jul. 24, 2012

(65) Prior Publication Data

US 2013/0020524 A1   Jan. 24, 2013

Related U.S. Application Data

(60) Provisional application No. 61/511,098, filed on Jul. 24, 2011.

(51) Int. Cl.
*C04B 35/00*   (2006.01)

(52) U.S. Cl.
USPC ............................................ 252/62.9 PZ

(58) Field of Classification Search
USPC ................ 252/62.9 R, 62.9 PZ; 210/358
See application file for complete search history.

(56) References Cited

U.S. PATENT DOCUMENTS

| | | | | |
|---|---|---|---|---|
| 5,112,433 | A | * | 5/1992 | Dawson et al. ............. 423/593.1 |
| 6,342,177 | B1 | * | 1/2002 | Kitaoka ........................ 264/307 |
| 7,696,549 | B2 | | 4/2010 | Ramesh |

OTHER PUBLICATIONS

Stringer, 'Structure-Property-Performance Relationships of New High Temperature Relaxors for Capacitor Applications', 2006, The Pennsylvania State University, Department of Materials Science and Engineering, pp. 15, 33-36, 102 and 146.*
Berkeley Researchers Take the Lead Out of Piezoelectrics, Nov. 16, 2009, http://www.brightsurf.com/news/headlines/504321Berkeley_Researchers_Take_the_Lead_Out_of_Piezoelectrics.html, Lawrence Berkeley National Laboratory, Berkeley, California.

* cited by examiner

*Primary Examiner* — Emily Le
*Assistant Examiner* — Lynne Edmondson
(74) *Attorney, Agent, or Firm* — Hudak, Shunk & Farine Co. LPA

(57) ABSTRACT

Piezoelectric ceramics that can be used in high temperature actuators. The piezoelectric ceramics have various desirable properties, for example the materials do not depole up to about 400° C. and have large piezoelectric coefficients >400 pm/V. In addition the thickness mode electromechanical coupling coefficient is large, increasing from 0.5 to 0.65 with temperature. The planar electromechanical coefficient is around 0.40 and does not show a significant dependence on temperature. These materials are highly polarizable with remnant polarization around 50 $\mu C/cm^2$ and are electrically hard with coercive field above 20 kV/cm. They exhibit single crystal like ferroelectric behavior with square hysteresis loops. Such properties make these materials a piezoelectric ceramic that can be used in stack actuators at high temperatures. Methods for preparing the piezoelectric ceramics are also disclosed.

18 Claims, 2 Drawing Sheets

HIGH TEMPERATURE PIEZOELECTRIC CERAMICS

CROSS REFERENCE

This Application claims the benefit of priority under 35 U.S.C. §119 of U.S. Provisional Application Ser. No. 61/511,098, filed on Jul. 24, 2011, herein fully incorporated by reference.

FIELD OF THE INVENTION

The present invention relates to piezoelectric ceramics that can be used in high temperature actuators. The piezoelectric ceramics have various desirable properties, for example the materials do not depole up to about 400° C. and have large piezoelectric coefficients >400 pm/V. In addition the thickness mode electromechanical coupling coefficient is large, increasing from 0.5 to 0.65 with temperature. The planar electromechanical coefficient is around 0.40 and does not show a significant dependence on temperature. These materials are highly polarizable with remnant polarization around 50 $\mu C/cm^2$ and are electrically hard with coercive field above 20 kV/cm. They exhibit single crystal like ferroelectric behavior with square hysteresis loops. Such properties make these materials a piezoelectric ceramic that can be used in stack actuators at high temperatures. Methods for preparing the piezoelectric ceramics are also disclosed.

BACKGROUND OF THE INVENTION

It is believed that the state of the art commercial high temperature piezoelectric actuators can be used at relatively low temperatures, for example up to about 200° C. The limitation is due to the piezoelectric material itself. For sensor applications there are some piezoelectric materials that can be used at relatively high temperatures, over 1000° C. in some cases, such as quartz and langasites, but these materials are non-ferroelectric piezoelectrics. Thus their piezoelectric coefficients are very low (<10 pm/V). For actuator applications, the displacements needed require piezoelectric coefficients in the order of hundreds of pm/V in order to build a stack that has a practical size for any actuator application. Ferroelectric piezoelectrics have large piezoelectric coefficients ($d_{33}$) but are limited in their operation temperature.

Materials produced for large piezoelectric coefficients are based on $Pb(Mg_{1/3}Nb_{2/3})O_3$—$PbTiO_3$ (PMN-PT) single crystals with $d_{33}$>2000 pm/V in some cases. However, these materials can only be used up to about 70-90° C. Recent advances by addition of $Pb(In_{1/2}Nb_{1/2})O_3$ into PMN-PT, increased the operating temperature up to about 110° C. with minor decrease in piezoelectric coefficients. However, these temperatures are still low for several applications that require operating temperatures >300° C.

Materials proposed for high temperature piezoelectric are PZT based materials (Navy Type II) with Curie temperature ($T_c$) around 350° C. and $d_{33}$ around 375 pm/V at room temperature. Curie temperature is the intrinsic limitation for the piezoelectric application above which the property does not exist. However, in most cases the limitation is due to de-poling and increased conductivity of the ceramics. For ferroelectrics to obtain a net piezoelectric effect, ceramics need to be poled by application of large electric fields which align dipoles in crystallographically allowed directions closest to the poling field. Upon removal of the field, most dipoles do not rotate back, resulting in net polarization and piezoelectric effect. The polarization (charge per unit area) in this case is due to bound charge and the ceramic stays insulating. However, when most ceramics are heated up, they become conductive and the strain inducing voltage drop across the material decreases. In addition, the temperature assisted motion of dipoles results in reorientation and randomization. This results in disappearance of a net piezoelectric effect. The electromechanical coefficients measured using the resonance peaks during impedance analysis decrease as the materials get de-poled. In some cases, especially for the ferroelectric materials with high $T_c$, de-poling happens at a lower temperature than $T_c$ and becomes the limitation in operating temperature.

In view of the above, it would be desirable to provide piezoelectric ceramics that have various desirable properties. Methods for the production of piezoelectric ceramics are also described.

SUMMARY OF THE INVENTION

It is an object of the present invention to provide piezoelectric ceramics that are operational at relatively high temperatures.

Yet another object is to provide a method for producing the piezoelectric ceramics.

Still another object is to provide piezoelectric ceramics that have relatively high piezoelectric coefficients, and further to provide stack actuators including the piezoelectric ceramics, the actuators able to be produced in a reasonable size.

A further object of the invention is to provide piezoelectric ceramics having a large thickness and longitudinal mode electromechanical coupling coefficient.

An additional object of the present invention is to produce piezoelectric ceramics that are highly polarizable with remnant polarization around 50 $\mu C/cm^2$ and are electrically hard with coercive field above 20 kV/cm.

An additional object is to provide piezoelectric ceramics that are based on a $Bi(Zn_{1/2}Zr_{1/2})O_3$—$BiScO_3$—$PbTiO_3$ (BZZ-BS-PT) formulation.

Yet another object is to provide piezoelectric ceramics having relatively high Curie temperatures, such as greater than 400° C.

Accordingly, in one aspect of the present invention a piezoelectric ceramic composition is disclosed, comprising a composition based on a $Bi(Zr_{1/2}Zr_{1/2})O_3$—$BiScO_3$—$PbTiO_3$ (BZZ-BS-PT) formulation.

In another aspect, a process for producing piezoelectric ceramics is disclosed, comprising the steps of mixing, calcination, forming, for example as bulk ceramics, thick films and thin films, and sintering a $Bi(Zn_{1/2}Zr_{1/2})O_3$—$BiScO_3$—$PbTiO_3$ based composition.

DETAILED DESCRIPTION OF THE INVENTION

Piezoelectric ceramics have been developed that are beneficially operational at high temperatures and can be used for example, for actuator applications. In various embodiments, these piezoceramics have high operating temperature and high piezoelectric coefficients allowing building stack actuators in reasonable size for practical applications which have limited real estate.

In a preferred embodiment, the compositions are based on a $Bi(Zn_{1/2}Zr_{1/2})O_3$—$BiScO_3$—$PbTiO_3$ (BZZ-BS-PT) formulation. Various weight ratios of the BZZ, BS and PT can be utilized to prepare piezoelectric ceramics having tailored properties. The BZZ can range generally from 0% or 1% to about 30%, desirably from about 3% or 5% to about 15%, and preferably is about 5% based on the total of BZZ, BS and PT in the composition. The BS can range generally from 25% to about 55%, desirably from about 30% to about 40%, and preferably is about 35% based on the total of BZZ, BS and PT in the composition. The PT can range generally from 45% to about 75%, desirably from about 60% to about 70%, and preferably is about 65% based on the total of BZZ, BS and PT in the composition.

In one beneficial embodiment, the composition 5% BZZ-35% BS-60% PT is near a morphotropic phase boundary (MPB). Near MPB piezoelectric and dielectric properties of the ferroelectric materials maximize. These compositions can be varied ±5% following the curved ternary MPB connecting two binary MPBs in between BS-PT and BZZ-PT.

The compositions are generally prepared in one embodiment as follows. Raw powders of related oxides, for example, $ZnO$, $ZrO_2$, $PbO$, $Bi_2O_3$, $Sc_2O_3$ and $TiO_2$ with purity levels greater than 99.9% were used. The powders were mixed in the stoichiometric amount and ball milled using yttria-stabilized zirconia balls. Milled powders were calcined at 750° C. for 3 hours in air. X-ray analysis showed that a single phase perovskite was obtained after calcination. Dried powders were then uniaxially pressed into pellets with 12.5 mm diameter steel die at 3000 MPa. To minimize Pb and Bi loss during sintering, Pb and Bi containing sacrificial powder was introduced to the sintering furnace. To form thick films, the powder was tape cast after mixing with binders, plactisizers, solvents and surfactants.

In addition, the compositions can be doped by several cations including, but not limited to, Zr, Mn, In, Yb, V, Ti, Nb, Sc, Mg, Zn, Ba, La, and Sr.

Figure 1:
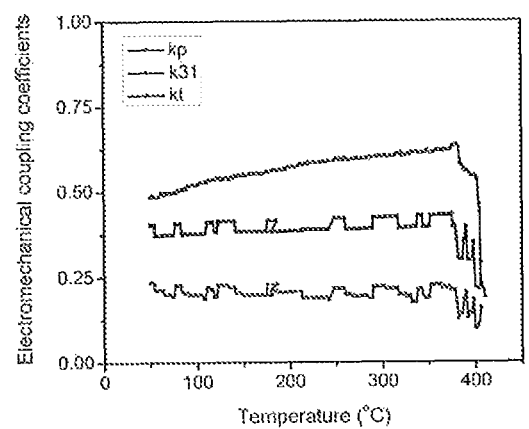
FIG. 1 is a graph illustrating temperature dependence of electromechanical coupling coefficients calculated from resonance/anti resonance peaks of impedance spectrum.
Figure 2:
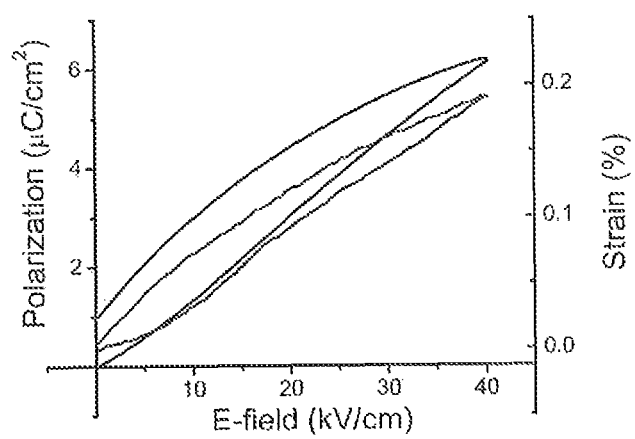
FIG. 2 is a graph illustrating unipolar polarization and strain as function of electric field at room temperature.
Figure 3:
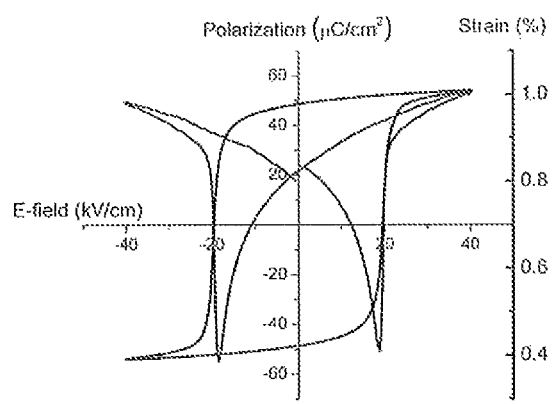
FIG. 3 is a graph illustrating bipolar polarization and strain as function of electric field at room temperature.
Figure 4:
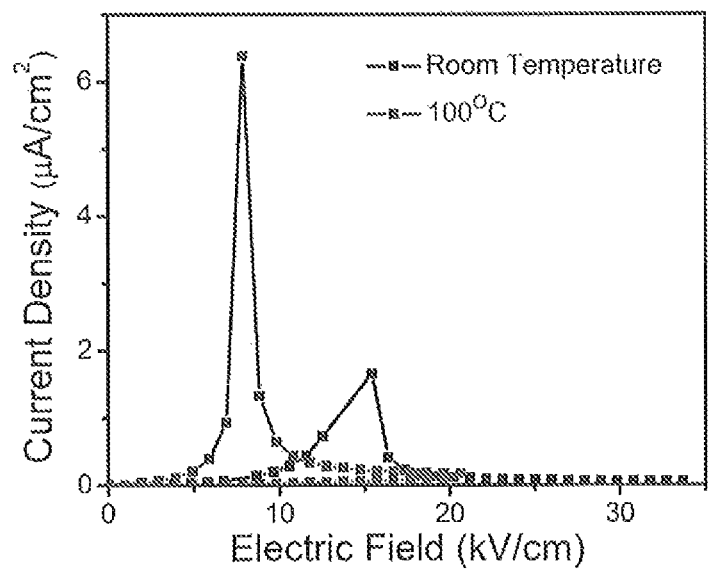
FIG. 4 is a graph illustrating current density as a function of electric field at room temperature and 100° C. during poling.

In some embodiments, the Curie temperatures ($T_c$) for these materials were above 400° C. and thermal depoling did not occur until the $T_c$. FIG. 1 shows the temperature dependence of the electromechanical coupling coefficients of these materials. The values for these electromechanical coupling coefficients were high. Square of the electromechanical coupling coefficient is related to the energy conversion efficiency between mechanical and electrical energy. Large depoling temperature coupled with large electromechanical coupling coefficient makes these materials exceptional for high temperature actuators. FIG. 2 shows unipolar field induced strain and polarization. The slope of the field induced strain is piezoelectric coefficient. At room temperature the piezoelectric coefficient is around 475 pm/V. Bipolar measurements, see FIG. 3 show that the polarization rotation was very sharp giving single crystal like square hysteresis loops and extremely large remnant polarization (50 μC/cm2). In addition, the coercive field was around 20 kV/cm. This large coercive field makes the materials electrically harder and makes it more difficult to depole the material by external forces both mechanical and thermal. FIG. 4 illustrates current density as a function of electric field at room temperature and 100° C. during poling.

In view of the above, piezoelectric ceramics are disclosed that can be used at high temperature actuators. These materials do not depole up to about 400° C. and have large piezoelectric coefficients >400 pm/V in some embodiments. In addition the thickness mode electromechanical coupling coefficient in some embodiments is large increasing from 0.5 to 0.65 with temperature. The planar electromechanical coefficient for some materials is around 0.40 and do not show a significant dependence on temperature. They can exhibit single crystal like ferroelectric behavior with square hysteresis loops.

All of these properties summarized allow a piezoelectric ceramic to be provided that can be used, for example in stack actuators at high temperatures. Some of the applications for these materials are fuel and gas modulation in jet engines, oil drilling, ultrasonic drilling in hot surfaces such as Venus, vibration dampening on turbine blades and other hot components, energy harvesting on hot and vibrating environments such as near engines, and power generation in thermoacoustic engines. Some of the end users for this technology are: (i) NASA, (ii) Air Force, (iii) Navy, and (iv) companies that work on drilling for oil.

While in accordance with the patent statutes the best mode and preferred embodiment have been set forth, the scope of the invention is not limited thereto, but rather by the scope of the attached claims.

What is claimed is:

1. A piezoelectric ceramic composition, comprising:
   a composition based on a Bi(Zn½,Zr½)O3-BiScO3-PbTiO3 (BZZ-BS-PT) formulation,
   wherein the BZZ is present in an amount from about 1% to about 30%, the BS is present in an amount from about 25% to about 55%, and the PT is present in an amount from about 45% to about 75% based upon the total weight of BZZ, BS and PT in the composition.

2. The composition according to claim 1, further including a dopant.

3. The composition according to claim 2, wherein the dopant comprises one or more of Zr, Mn, In, Yb, V, Ti, Nb, Sc, Mg, Zn, Ba, La, and Sr.

4. The composition according to claim 1, wherein the BZZ is present in an amount from about 3% to about 15%, the BS is present in an amount from about 30% to about 40%, and the PT is present in an amount from about 60% to about 70%.

5. The composition according to claim 4, the BZZ is present in an amount of about 5%, the BS is present in an amount of about 35% and the PT is present in an amount of 65%.

6. The composition according to claim 1, wherein the composition has a Curie temperature above 400° C., and wherein the composition has a piezoelectric coefficient of greater than 400 pm/v.

7. The composition according to claim 1, wherein the composition has a thickness mode electromechanical coupling coefficient that increases from 0.5 to 0.65 with temperature.

8. The composition according to claim 1, wherein the composition has a remnant polarization of about 50 μC/cm$^2$, and wherein the composition has a coercive field of about 20 kV/cm.

9. The composition according to claim 1, wherein the compositions exhibit single crystal-like ferroelectric behavior with square hysteresis loops.

10. A piezoelectric actuator, comprising the composition according to claim 1.

11. A piezoelectric actuator, comprising the composition according to claim 1.

12. A process for producing a piezoelectric ceramic, comprising the steps of:

mixing a composition comprising oxides including elements of Bi, Sc, Ti, Zn, Zr and Pb;
milling the composition, and
sintering the composition to form a ceramic having the following formulation:

$Bi(Zn_{1/2},Zr_{1/2})O_3$-$BiScO_3$-$PbTiO_3$ (BZZ-BS-PT), wherein the BZZ is present in an amount from about 1% to about 30%, the BS is present in an amount from about 25% to about 55%, and the PT is present in an amount from about 45% to about 75% based upon the total weight of BZZ, BS and PT in the composition.

13. The process according to claim 12, wherein the oxides comprise $ZnO$, $ZrO_2$, $PbO$, $Bi_2O_3$, $Sc_2O_3$ and $TiO_2$.

14. The process according to claim 13, wherein the composition is calcinated at about 750° C. for about 3 hours.

15. The process according to claim 14, wherein prior to sintering, the composition is tape cast.

16. The process according to claim 12, wherein the BZZ is present in an amount from about 3% to about 15%, the BS is present in an amount from about 30% to about 40%, and the PT is present in an amount from about 60% to about 70%.

17. The process according to claim 13, wherein a dopant is added to the composition.

18. The process according to claim 17, wherein the dopant comprises one or more of Zr, Mn, In, Yb, V, Ti, Nb, Sc, Mg, Zn, Ba, La, and Sr.

* * * * *

UNITED STATES PATENT AND TRADEMARK OFFICE
CERTIFICATE OF CORRECTION

PATENT NO. : 8,518,291 B2
APPLICATION NO. : 13/556636
DATED : August 27, 2013
INVENTOR(S) : Alp Sehirlioglu, Ali Sayir and Frederick Dynys It is certified that error appears in the above-identified patent and that said Letters Patent is hereby corrected as shown below:

In the Specification

Column 2, line 44, formula written incorrectly: $Bi(Zr_{1/2}Zr_{1/2})O_3\text{-}BiScO_3\text{-}PbTiO_3$ (BZZ-BS-PT)
Correct formula is: $Bi(Zn_{1/2},Zr_{1/2})O_3\text{-}BiScO_3\text{-}PbTiO_3$ (BZZ-BS-PT)

In the Claims

Claim 12, column 5, line 6, formula written incorrectly: $Bi(Zr_{1/2},Zr_{1/2})O3\text{-}BiScO3\text{-}PbTiO3$ (BZZ-BS-PT)
Correct formula is: $Bi(Zn_{1/2},Zr_{1/2})O_3\text{-}BiScO_3\text{-}PbTiO_3$ (BZZ-BS-PT)

Signed and Sealed this
Third Day of December, 2013

Margaret A. Focarino
*Commissioner for Patents of the United States Patent and Trademark Office*